United States Patent [19]

Kim et al.

[11] Patent Number: 5,715,353
[45] Date of Patent: Feb. 3, 1998

[54] SINE-WAVE MODULATOR AND PLAYBACK/RECORDING MODULATOR-DEMODULATOR FOR A HIGH-FIDELITY VIDEO PLAYBACK/RECORDING SYSTEM

[75] Inventors: Chun-Sub Kim; Yong-Serk Kim, both of Suwon, Rep. of Korea

[73] Assignee: Samsung Electronics Co., Ltd., Kyungki-do, Rep. of Korea

[21] Appl. No.: 656,443

[22] Filed: May 31, 1996

[30] Foreign Application Priority Data

May 31, 1995 [KR] Rep. of Korea ............... 1995-14072

[51] Int. Cl.[6] ............... H04N 5/76; H04N 5/92; G11B 5/02; G11B 20/06
[52] U.S. Cl. ............... 386/46; 386/26; 360/29; 360/30
[58] Field of Search ............... 386/46, 93, 95, 386/96, 26–29; 348/735, 724, 726; 360/29, 30; 332/127, 138, 117; 329/325; H04N 5/92, 9/79, 5/76

[56] References Cited

U.S. PATENT DOCUMENTS

| | | |
|---|---|---|
| 4,459,566 | 7/1984 | Lane ............... 331/135 |
| 4,595,992 | 6/1986 | Drogin ............... 364/569 |
| 4,916,411 | 4/1990 | Lymer ............... 331/25 |

*Primary Examiner*—Thai Tran
*Attorney, Agent, or Firm*—Sughrue, Mion, Zinn, Macpeak & Seas, PLLC

[57] ABSTRACT

A playback/recording modulating-demodulating device, having a voltage-controlled oscillator (VCO), a voltage-current inverter (VCI), a band-pass filter, an amplitude limiter, and a phase-locked loop. In playback mode, the playback input signal is applied to the band-pass filter, the phase-locked loop is activated, and the VCI is set to produce a reference signal which controls the band-pass filter to tune the playback input signal. The tuned playback signal is applied to the amplitude limiter which produces an amplitude-limited signal which is applied to the phase-locked loop to produce a demodulated playback output signal. In record mode, the phase-locked loop is deactivated, the VCO produces a signal having a frequency which varies according to the voltage of a record input signal, and the VCI outputs a current control signal, having an output current related to the voltage of the record input signal, which is applied to the band-pass filter to control its bandwidth. A signal having a frequency value determined by the voltage of the record input signal is output by the VCO and applied to the band-pass filter, which outputs a record output signal. Thus, in the record mode, the bandwidth of the band-pass filter is related to the frequency of the signal which it filters.

11 Claims, 2 Drawing Sheets

SINE-WAVE MODULATOR AND PLAYBACK/ RECORDING MODULATOR-DEMODULATOR FOR A HIGH-FIDELITY VIDEO PLAYBACK/RECORDING SYSTEM

BACKGROUND OF THE INVENTION

The present invention relates to a high-fidelity video playback/recording system, and more particularly, to a sine-wave modulator and a playback/recording modulator-demodulator for a high-fidelity (Hi-Fi) video playback/ recording system which eliminates harmonic components when converting a square-wave signal into a sine-wave signal.

FIG. 1 is a block diagram of a conventional playback/ recording modulator-demodulator for a Hi-Fi video playback/recording system. A band-pass filter (BPF) 10, an amplitude limiter 20, a phase-sensitive detector 30, and a loop filter 40 are controlled by a playback/recording (PB/ REC) control signal so as to be inoperative in a mode in which video signals are recorded. A voltage-controlled oscillator (VCO) 50 produces a square-wave signal having a frequency related to a record input signal. The square-wave signal produced from the VCO 50 extends over the entire frequency band of the Hi-Fi video playback/recording system. When a video signal is recorded on a tape in this manner, a large quantity of electrical noise may be generated, and the square-wave signal is filtered by a low-pass filter 60 where it is converted into a sine-wave signal for recording.

In a playback process, the PB/REC control signal controls the low-pass filter so that it does not operate. A playback input signal is applied to a recording head from the recorded tape, is transmitted to a phase-locked loop (PLL), which includes the phase-sensitive detector 30, loop filter 40 and VCO 50, by way of the band-pass filter 10 and limiter 20, to thereby be demodulated and produced as a playback output signal.

The conventional sine-wave modulator, however, has a problem in that higher harmonic components may remain in the low frequency band output by the low-pass filter 60. Additionally, the conventional sine-wave modulator for record modulation is designed to include a low-pass filter, which gives rise to an increase in the size of the chip which makes up the modulator.

The present invention encompasses a sine-wave modulator and a playback/recording modulator-demodulator for a high-fidelity (Hi-Fi) video playback/recording system.

It is a first object of the present invention to provide such a sine-wave modulator that eliminates harmonic components in a sine-wave output signal.

It is a second object of the present invention to provide a sine-wave modulator without a low-pass filter to decrease the size of the chip which makes up the modulator.

It is a third object of the present invention to provide a playback sine-wave modulator-demodulator for a Hi-Fi video playback/recording system which has a simple structure and which eliminates harmonic components in a sine-wave output signal.

In order to achieve these objects, the inventive sine-wave modulator includes a voltage-controlled oscillator for generating a square-wave signal having a frequency equivalent to an input signal; a voltage-current inverter for generating a current control signal in response to the input signal; and a variable bandwidth band-pass filter for varying a filtering band with the current control signal and filtering the square-wave signal to be converted into a sine-wave signal.

The inventive playback/recording modulator-demodulator for a high-fidelity video playback/recording system, includes a voltage-controlled oscillator for generating a square-wave signal having a frequency equivalent to a predetermined recording input signal; a switching circuit for receiving respectively the square-wave signal and a playback input signal produced from a recording medium, and selecting and producing one input signal between the above two input signals in response to a predetermined control signal; a voltage-current inverter for generating a current control signal equivalent to the voltage level variation of the recording input signal by the control signal of a recording state; a band-pass filter for varying a filtering band with the current control signal to tune and produce the output signal of the switching circuit; an amplitude limiter for limiting the amplitude of the output signal of the band-pass filter to produce the output signal; a phase-sensitive detector for detecting a difference in phase between the square-wave signal and the output signal of the amplitude limiter to produce a phase difference signal; and a loop filter for tuning the phase difference signal to a predetermined frequency band.

DETAILED DESCRIPTION OF THE INVENTION

The present invention will now be described in detail with reference to the accompanying drawings.

Figure 1:
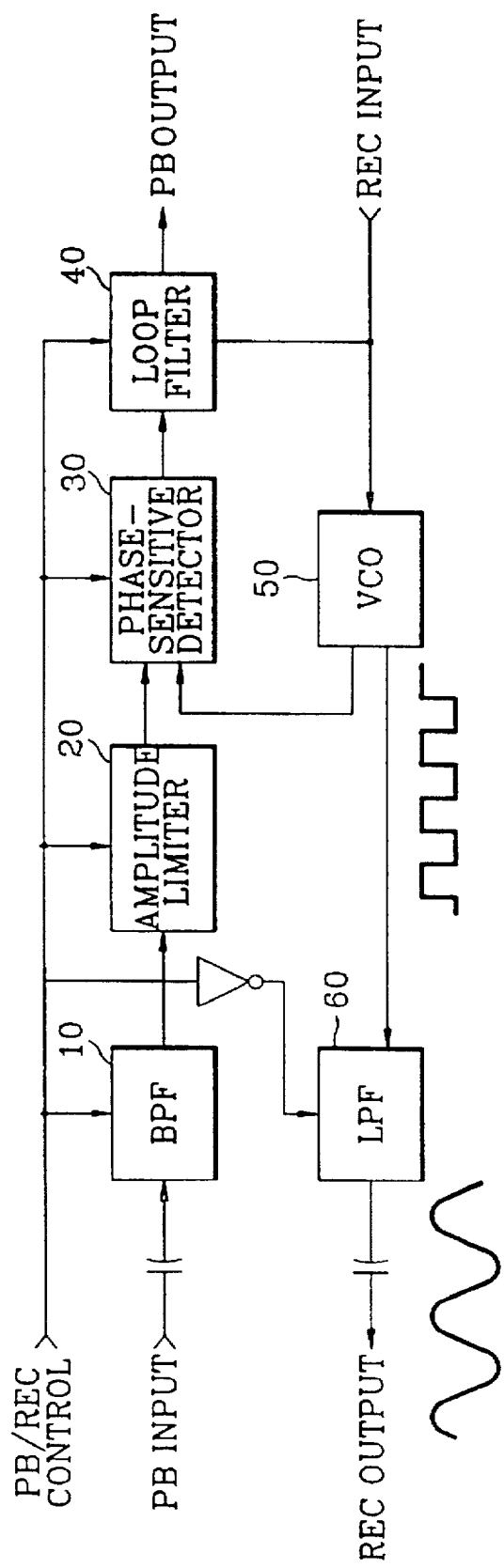
FIG. 1 is a block diagram of a conventional playback/ recording modulator-demodulator for a high-fidelity playback/recording system.
Figure 2:
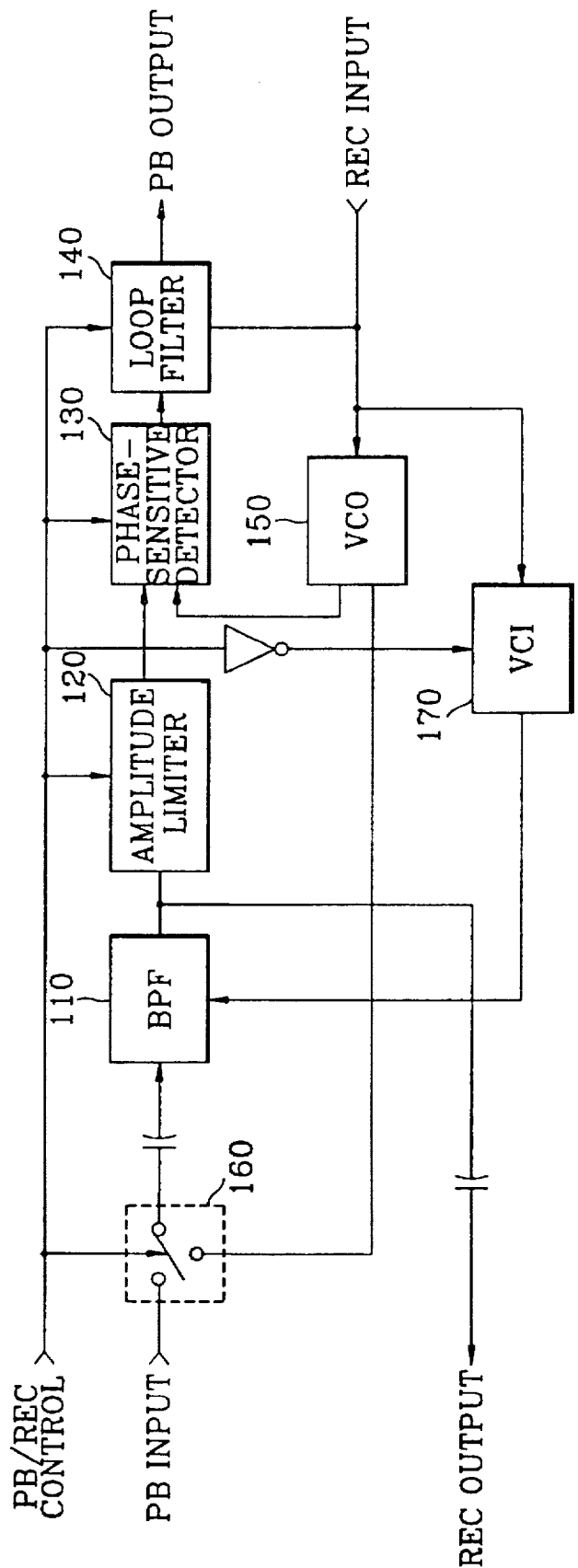
FIG. 2 is a block diagram of a playback/recording modulator-demodulator for a high-fidelity playback/ recording system in accordance with a preferred embodiment of the present invention.

FIG. 2 is a block diagram of a playback/recording modulator-demodulator (MODEM) in accordance with a preferred embodiment of the present invention.

A voltage-controlled oscillator (VCO) 150 oscillates and produces a square-wave signal whose output frequency is proportional to the voltage of a record input signal (REC). A switching circuit 160 receives a playback (PB) input signal and the square-wave signal respectively, and outputs one of these signals in response to a playback/recording (PB/REC) control signal. A voltage-current inverter (VCI) 170 generates, under the control of the PB/REC control signal, a current control signal equivalent to the voltage level variation of the REC input signal.

Band-pass filter (BPF) 110 is a variable bandwidth band-pass filter whose filtering band varies according to the current control signal output by VCI 170, and tunes the output signal produced from the switching circuit 160 in response to the current control signal. As the BPF 110, an operational transconductance amplifier (OTA) may be applied in accordance with the preferred embodiment of the present invention. An amplitude limiter 120 receives the output signal of the BPF 110 and holds the amplitude of the signal at a predetermined level in response to the PB/REC control signal and outputs the resulting signal.

The phase-sensitive detector 130 receives the output signal from the amplitude limiter 120 and the square-wave signal output by VCO 150 under the control of the PB/REC control signal, and detects a difference in phase between the two received signals to produce a phase difference signal. A loop filter 140 tunes the phase difference signal.

Referring to the structure of the above-mentioned playback/recording MODEM, the switching circuit 160 selects and produces the playback (PB) input signal in response to the PB/REC control signal. A phase-locked loop demodulating circuit including the BPF 110, amplitude limiter 120, phase-sensitive detector 130, loop filter 140 and VCO 150 demodulates and produces the PB output signal.

The VCI 170 produces a reference voltage control signal. Accordingly, the BPF 110 has a passband of 1.3 MHz in case of an NTSC left channel. The amplitude limiter 120, phase-sensitive detector 130 and loop filter 140 are controlled by the PB/REC signal so as not to operate during the recording process. The VCO 150 generates a square-wave signal having a frequency related to the voltage level of the REC input signal. PB/REC control signal causes VCI 170 to produce a current control signal having an output current which is proportionally related to the voltage level of the REC input signal.

The current control signal of the VCI 170 whose current varies with the voltage level variation of the REC input signal, changes the passband of the BPF 110. If the frequency of the REC input signal, the free-running frequency of the VCO 150 and the modulation index are equal to 20 kHz, 1.3 MHz, and 7, 5, respectively, the frequency of the square-wave signal produced from the VCO 150 drifts between 1.15 MHz and 1.45 MHz in response to the level of the REC input signal. Thus, the passband of the BPF 110 (fixed at 1.3 MHz as a reference frequency band at the time of demodulation) should drift between 1.15 MHz and 1.45 MHz to attain a stable sine-wave signal. Accordingly, the VCI 170 generates the current control signal whose output current varies with the voltage level variation of the REC input signal, and changes the cutoff frequency of the BPF 110 to shift the passband of the BPF 110.

The switching circuit 160 selects and outputs the square-wave signal produced from the VCO 150. The BPF 110 tunes the output signal of the switching circuit 160 to a passband which is determined in response to the current control signal of the VCI 170, and converts the signal into a sine-wave signal to produce a REC output signal.

According to the present invention, when recording video signals, a square-wave signal is converted into a stable sine-wave signal by changing the filtering band for conversion into a sine-wave signal in response to the voltage level variation of the REC input signal and removing the harmonic components. In addition, the absence of a low-pass filter is advantageous to single chip fabrication.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. A sine-wave modulating device for a high-fidelity video playback/recording system, comprising:
   voltage-controlled oscillating means for generating a square-wave signal having a frequency which is determined in response to an input signal;
   current control means for generating a current control signal in response to the input signal; and
   variable bandwidth filtering means for varying a filtering band in response to the current control signal and for filtering the square-wave signal and converting the square-wave signal into a sine-wave signal.

2. The device as recited in claim 1, wherein said current control means is a voltage-current inverter.

3. The device as recited in claim 1, wherein said input signal is a video signal which is to be recorded.

4. The device as recited in claim 3, wherein the frequency of the square-wave signal is determined in response to the voltage level of the video signal which is to be recorded, the current control signal has an output current which is determined in response to the voltage level of the video signal which is to be recorded, and the filtering band of said variable bandwidth filtering means is varied in response to the output current of the current control signal.

5. A playback/recording modulating-demodulating device for a high-fidelity video playback/recording system, comprising:
   voltage controlled oscillating means for generating a signal having a frequency determined by a recording input signal;
   current control means for generating a current control signal in response to the recording input signal;
   filtering means having a filtering band which varies according to said current control signal for filtering the signal generated by said voltage controlled oscillating means and outputting the filtered signal as a record output signal.

6. The device as recited in claim 5, wherein the frequency of the signal generated by said voltage controlled oscillating means is determined according to the voltage level of the recording input signal.

7. The device as recited in claim 6, wherein said current control means is a voltage-current inverter and the current control signal has an output current which is determined in accordance with the voltage level of the recording input signal.

8. A playback/recording modulating-demodulating device for a high-fidelity video playback/recording system, comprising:
   means for receiving a mode control signal indicating one of a recording mode and a playback mode;
   voltage-controlled oscillating means for generating, when said mode control signal indicates the recording mode, a first signal having a frequency which is determined in response to a recording input signal, and for generating, when said mode control signal indicates the playback mode, a second signal;
   switching output means for receiving respectively said first signal and a playback input signal produced from a recording medium, for selecting the first signal when the mode control signal indicates the recording mode and selecting the playback signal when the mode control signal indicates the playback mode, and for producing the selected signal as an output signal;
   current control means for generating a current control signal in response to the recording input signal when the mode control signal indicates the recording mode, and for generating a reference control signal when said mode control signal indicates the playback mode;
   first filtering means for, when the mode control signal indicates the recording mode, varying a filtering band according to said current control signal to tune the output signal of said switching output means and outputting a first tuned signal, said first tuned signal being a record output signal, and for, when the mode control signal indicates the playback mode, outputting a second tuned signal which is the playback input signal filtered by a bandwidth selected in response to the reference control signal;

amplitude limiting means, operative when the mode control signal indicates the playback mode, for holding the amplitude of the second tuned signal output by the first filtering means to produce an amplitude-limited signal;

phase-sensitive detecting means, operative when the mode control signal indicates the playback mode, for detecting a difference in phase between said second signal generated by said voltage-controlled oscillating means and the amplitude-limited signal output by said amplitude limiting means to produce a phase difference signal; and second filtering means, operative when the mode control signal indicates the playback mode, for tuning said phase difference signal to a predetermined frequency band.

9. The device as recited in claim 8, wherein the first signal and the second signal generated by said voltage-controlled oscillating means are square-wave signals.

10. The device as recited in claim 9, wherein the frequency of the signal generated by said voltage controlled oscillating means, when said mode control signal indicates the recording mode, is determined according to the voltage level of the recording input signal.

11. The device as recited in claim 10, wherein said current control means is a voltage-current inverter and, when said mode control signal indicates the recording mode, the current control signal has an output current which is determined in accordance with the voltage level of the recording input signal.

* * * * *